US012808052B2

(12) United States Patent
Verbaas et al.

(10) Patent No.: US 12,808,052 B2
(45) Date of Patent: Nov. 24, 2026

(54) DEPOSITION SYSTEMS WITH ROTATING ELECTROSTATIC CHUCK AND METHODS THEREOF

(71) Applicant: Tokyo Electron Limited, Tokyo (JP)

(72) Inventors: Melvin Verbaas, Austin, TX (US); Anthony Dip, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 430 days.

(21) Appl. No.: 18/315,137

(22) Filed: May 10, 2023

(65) Prior Publication Data

US 2024/0376602 A1 Nov. 14, 2024

(51) Int. Cl.

*C23C 16/458* (2006.01)
*C23C 16/455* (2006.01)
*H01J 37/32* (2006.01)

(52) U.S. Cl.

CPC .... *C23C 16/4586* (2013.01); *C23C 16/45565* (2013.01); *C23C 16/4581* (2013.01); *H01J 37/32715* (2013.01); *H01J 37/32807* (2013.01); *H01J 2237/3321* (2013.01)

(58) Field of Classification Search

CPC .......... C23C 16/4586; C23C 16/45565; C23C 16/4581; H01J 37/32715; H01J 37/32807; H01J 2237/3321

USPC ........................................................... 18/728

See application file for complete search history.

(56) References Cited

U.S. PATENT DOCUMENTS

| | | | | |
|---|---|---|---|---|
| 5,535,090 | A * | 7/1996 | Sherman | H01L 21/6833 279/128 |
| 5,782,979 | A * | 7/1998 | Kaneno | C30B 25/12 118/728 |
| 6,362,946 | B1 * | 3/2002 | Larsen | H01L 21/6833 361/234 |
| 7,220,319 | B2 * | 5/2007 | Sago | B25B 11/002 118/724 |
| 8,238,072 | B2 | 8/2012 | Fujisawa et al. | |
| 8,663,391 | B2 | 3/2014 | Matyushkin et al. | |
| 8,804,299 | B2 * | 8/2014 | Eytan | H01L 21/6875 361/230 |
| 11,600,512 | B2 | 3/2023 | Yoon et al. | |
| 2001/0043452 | A1 * | 11/2001 | Divakar | H01L 21/6833 279/128 |
| 2003/0010292 | A1 | 1/2003 | Kholodenko et al. | |
| 2003/0123213 | A1 | 7/2003 | Kosakai | |
| 2010/0132615 | A1 * | 6/2010 | Kato | C23C 16/4412 118/725 |
| 2012/0227886 | A1 * | 9/2012 | Hsiao | H01L 21/6833 29/559 |

(Continued)

FOREIGN PATENT DOCUMENTS

| | | | |
|---|---|---|---|
| CN | 109509700 | B | 3/2020 |
| CN | 107663080 | B | 5/2020 |

*Primary Examiner* — Parviz Hassanzadeh

(74) *Attorney, Agent, or Firm* — Slater Matsil, LLP

(57) ABSTRACT

A semiconductor processing apparatus includes a processing chamber with a showerhead and a circular ceramic susceptor disposed in the processing chamber, the ceramic susceptor being coupled to a central susceptor shaft. The ceramic susceptor includes a wafer pocket, which includes a ceramic electrostatic chuck for supporting a wafer. The ceramic susceptor is configured to rotate the wafer pocket under the showerhead, where the ceramic electrostatic chuck is configured to rotate within the wafer pocket.

21 Claims, 13 Drawing Sheets

(56) References Cited

U.S. PATENT DOCUMENTS

| | | | | |
|---|---|---|---|---|
| 2016/0083841 | A1* | 3/2016 | Honma | C23C 16/45551 118/728 |
| 2017/0125274 | A1 | 5/2017 | Swaminathan et al. | |
| 2017/0148652 | A1* | 5/2017 | Hipp | H01L 21/68785 |
| 2018/0174880 | A1 | 6/2018 | Swaminathan et al. | |
| 2019/0181028 | A1 | 6/2019 | Patel et al. | |
| 2020/0126836 | A1* | 4/2020 | Yoon | H01R 39/26 |
| 2024/0136161 | A1* | 4/2024 | Leeser | H01J 37/32715 |
| 2024/0355593 | A1* | 10/2024 | Verbaas | C23C 16/4586 |

* cited by examiner

DEPOSITION SYSTEMS WITH ROTATING ELECTROSTATIC CHUCK AND METHODS THEREOF

TECHNICAL FIELD

The invention relates generally to the field of semiconductor device manufacturing equipment and methods and, more particularly, to deposition systems with rotating electrostatic chuck and methods thereof.

BACKGROUND

An integrated circuit (IC) includes a network of electronic components in a monolithic structure formed by processing a semiconductor wafer through a series of patterning levels. At each level, layers of diverse materials may be deposited and patterned using lithography and etch techniques that transfer a pattern of actinic radiation to targeted layers. A thin film layer can be vapor deposited on multiple wafers in a batch process by loading multiple wafers into wafer pockets on a susceptor in a batch manufacturing tool that has a showerhead or showerheads above the wafers. The wafer-to-wafer thickness and composition uniformity of the thin film is improved by rotating the wafers under the showerheads during vapor deposition. When the wafers are not clamped down, rotation can dislodge the wafers causing them to move causing degradation in across wafer-thin film composition and thickness uniformity.

Vapor deposition processes can include chemical vapor deposition (CVD) and atomic layer deposition (ALD). Some of these processes may require elevated temperatures as high as 800° C. For high temperature processing susceptors may be comprised of ceramic materials such as aluminum nitride and quartz.

SUMMARY

A semiconductor processing apparatus includes a processing chamber with a showerhead and a circular ceramic susceptor disposed in the processing chamber, the ceramic susceptor being coupled to a central susceptor shaft. The ceramic susceptor includes a first wafer pocket, which includes a first ceramic electrostatic chuck for supporting a first wafer. The ceramic susceptor is configured to rotate the first wafer pocket under the showerhead, where the first ceramic electrostatic chuck is configured to rotate within the first wafer pocket.

A method of forming an apparatus for processing a semiconductor includes providing a circular ceramic susceptor with a plurality of wafer pockets, the circular ceramic susceptor being supported by a central shaft. The method includes assembling a plurality of ceramic electrostatic chucks, where each of the ceramic electrostatic chucks including wafer pockets with underlying electrostatic electrodes. The method includes positioning one of the ceramic electrostatic chucks in each of the wafer pockets, and configuring the circular ceramic susceptor and the central shaft to rotate.

A method of operating a semiconductor processing apparatus includes loading a first semiconductor wafer onto a first ceramic electrostatic chuck in a ceramic susceptor disposed in a semiconductor processing chamber, and applying first electrostatic voltage signals to a first bipolar electrostatic electrode in the first ceramic electrostatic chuck, and chucking the first semiconductor wafer. The method includes loading a second semiconductor wafer onto a second ceramic electrostatic chuck in the ceramic susceptor, and applying second electrostatic voltage signals to a second bipolar electrostatic electrode in the second ceramic electrostatic chuck, and chucking the second semiconductor wafer. The method includes rotating the susceptor to pass the first and the second semiconductor wafers under a showerhead, and depositing a thin film on the first and the second semiconductor wafers when rotating the susceptor. The method includes stopping the rotating of the susceptor after the depositing; applying third electrostatic voltage signals to the first bipolar electrostatic electrode to de-chuck the first semiconductor wafer and unloading the first semiconductor wafer; and applying fourth electrostatic voltage signals to the second bipolar electrostatic electrode to de-chuck the second semiconductor wafer and unloading the second semiconductor wafer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments. For example, when this application describes electrostatic chucks and methods of making electrostatic chucks it will be apparent to persons skilled in the art that similar methods could be employed to form the electrostatic chucks described herein or to form similar electrostatic chucks.

Figure 1:
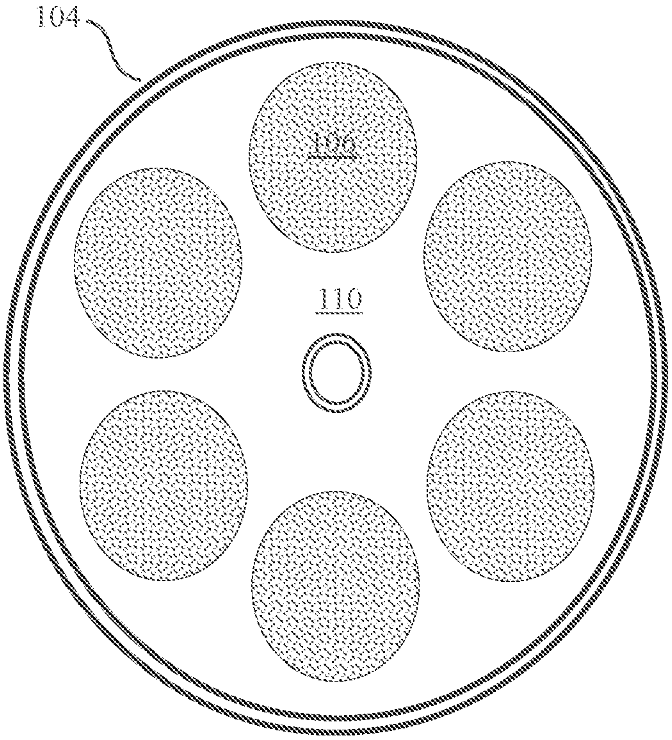
FIG. 1 is a top-down view of a susceptor with six wafer pockets.
Figure 2:
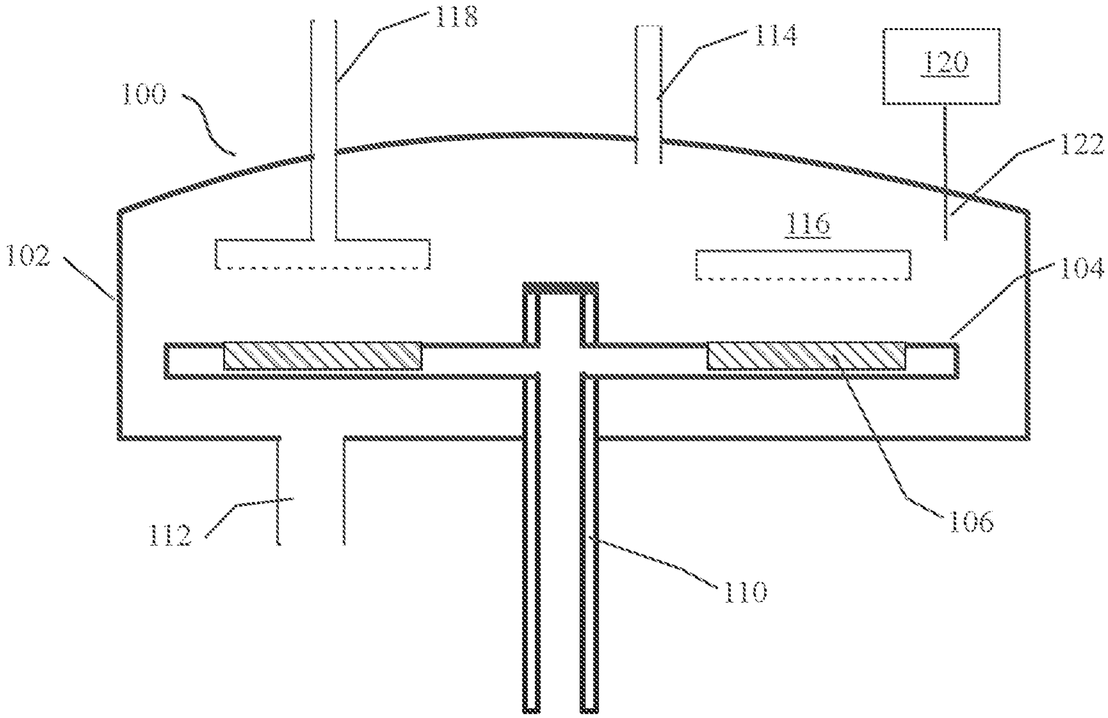
FIG. 2 is a cross-sectional schematic view of a batch apparatus for depositing a thin film on wafers.

A batch manufacturing apparatus for vapor depositing thin films on wafers is illustrated in FIGS. 1 and 2.

FIG. 1 illustrates a top-down view of a circular susceptor 104 with six wafer pockets 106 for holding six wafers. Other susceptors may have a different number of wafer pockets 106. The circular susceptor 104 is attached to a central shaft 110 that rotates during thin film deposition. The circular susceptor 104 may be made of a metal such as brass or aluminum for processing temperatures up to about 200° C., a metal such as nickel or stainless steel for processing temperatures up to about 600° C., and a ceramic such as aluminum nitride or quartz for processing temperatures up to about 800° C.

FIG. 2 illustrates a cross-sectional view of a batch thin film deposition apparatus 100 in accordance with various embodiments. In various embodiments, the batch thin film deposition apparatus 100 may comprise a vapor deposition process. The vapor deposition process may be a chemical vapor deposition (CVD) process or an atomic layer deposition (ALD) process.

The circular susceptor 104 and central shaft 110 rotate within processing chamber 102. Wafer pockets 106 pass under a showerhead 116 or under showerheads above the wafer pockets 106 during thin film vapor deposition as the circular susceptor 104 rotates. A first gas inlet tube 118 or gas inlet tubes supply reactant gases to the showerheads 116. A second gas inlet tube 114 may supply gases such as purging gases directly to the processing chamber 102. In further embodiments, purging gases may also be supplied to showerheads 116 separate from the showerheads 116 coupled to the reactant gases. An exhaust port 112 coupled to a vacuum pump, can evacuate the processing chamber 102 prior to thin film deposition and can remove spent reactant gases during thin film deposition. The CVD or ALD process may be plasma enhanced by providing an antenna 122 coupled to a radio frequency (RF) power supply 120.

Rotating the circular susceptor 104 during thin film vapor deposition improves across wafer thin film composition and thickness uniformity. Circular susceptor 104 may be capable of rotating up to about 250 rpm during thin film vapor deposition. Centrifugal forces may displace the wafers within the wafer pockets 106 during deposition. Wafer movement during deposition may degrade across wafer thin film composition and thickness uniformity. For example, centrifugal forces may cause the edge of the wafer farthest from the central shaft to contact the edge of the wafer pocket 106. When this occurs, the wafer environment is not symmetrical. An unsymmetrical wafer environment is likely to result in nonuniform across wafer thin film properties and thickness.

In various embodiments, the wafers may be prevented from being displaced during the deposition process by clamping them in place using an electrostatic chuck. When the thin film deposition process is not plasma assisted, a bipolar or multipolar electrostatic chuck may be used. Embodiment bipolar and multipolar electrostatic chucks comprise electrodes that are electrically insulated from and in close proximity to (about 0.5 mm to 5 mm) the backside of the semiconductor wafer.

In various embodiments, direct current (DC) voltages applied to the electrostatic electrodes of the electrostatic chuck may be in the range of about 500 V to 1500 V. In one embodiment, in a bipolar chuck, a high positive DC voltage is applied to a first bipolar electrostatic electrode and a high negative DC voltage is applied to a second bipolar electrostatic electrode. When a multipolar electrostatic chuck is used, multiple DC voltages may be applied to the multipolar electrostatic electrodes. In various embodiments, the DC voltages may be multiple DC voltage levels, time-varying DC voltage levels or pulses, alternating positive and negative DC voltages or pulses, and combinations thereof. When depositing a thin film using a plasma enhanced CVD (PECVD) process, a single DC voltage level may be applied to all the electrostatic electrodes to form a monopolar electrostatic chuck.

Figure 3:
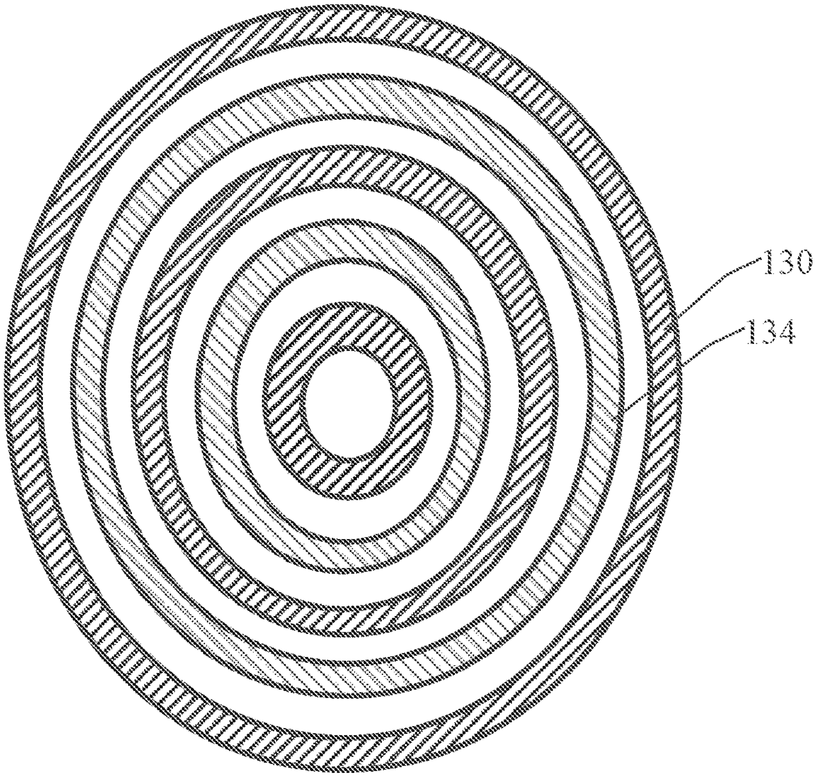
FIG. 3 is a top-down view illustrating electrostatic electrodes in an electrostatic chuck.

FIG. 3 is a top-down illustration of electrostatic electrodes on a bipolar electrostatic chuck. Positive and negative voltages used to clamp a semiconductor wafer to the electrostatic chuck may be applied to alternating positive electrostatic electrodes 130 and negative electrostatic electrodes 134. For good clamping, the positive and negative electrostatic electrodes 130 and 134 should be in close proximity, preferably 5 mm or less, to the backside of the semiconductor wafer. The layout of electrodes in FIG. 3 illustrates one example of a bipolar or multipolar electrostatic chuck. Many other bipolar and multipolar electrostatic electrode layouts are possible in various embodiments.

When a wafer is loaded onto a bipolar electrostatic chuck, a positive DC voltage between about 500 V and 1500 V may be applied to a first set of electrostatic electrodes 130 and a negative DC voltage between about −500 V and −1500 V may be applied to a second set of electrostatic electrodes 134 interleaved with the first set of electrostatic electrodes 130. As discussed previously, these DC voltages may be ramped, stepped, or may be constant for periods of time.

Clamping wafers is especially important when wafers are not flat such as wafers that are warped due to stress. 3D structures such as 3D NAND structures are formed by stacking as many as a hundred or more alternating layers of conductive and insulating materials. When thermal expansion coefficients of these layers are mismatched, high stresses may be generated causing wafer bowing. Inadequate flatness may affect sidewall profiles of etched features, may affect step coverage of the deposited thin film, and may make temperature control of the wafer from the backside difficult.

When a wafer is severely warped, clamping voltages may be applied in a stepwise fashion. The clamping voltages may first be applied to electrostatic electrodes near the center of the wafer. This may pull the center of the wafer flat against the electrostatic chuck bringing the donut region of the wafer closer to the electrostatic chuck. The clamping voltages may then be applied to electrostatic electrodes in the donut region of the wafer additionally flattening the wafer and bringing the outer edges of the wafer close to the electrostatic chuck. Lastly, electrostatic clamping voltages may be applied to the outermost electrostatic electrodes to completely flatten the wafer against the electrostatic chuck. After the thin film deposition process is completed, electrostatic de-chucking voltages may be applied to the electrostatic electrodes in reverse order to release (de-chuck) the wafer.

FIGS. 4, 5, 6, 7, and 8 illustrate cross sectional views of example embodiments illustrating representative ceramic electrostatic chucks (ceramic chuck) 109 formed under the wafer pockets 106 in a circular ceramic susceptor (ceramic susceptor) 105. The cross-sectional views show half of the ceramic susceptor 105 from the middle of the central shaft 110 to the outer edge of the ceramic susceptor 105. The ceramic chuck 109 may have liquid channels to heat and cool the chuck, gas channels to heat and cool the backside of the wafer 124, an embedded resistance heater to raise the temperature of the chuck, and embedded sensors to measure temperature, pressures, voltages, and motion of the ceramic chuck 109. These items are omitted from the drawings for clarity. For operating at process temperatures up to about 800° C., the susceptor may be comprised of a ceramic material such as alumina, zirconia, aluminum nitride, silicon carbide, tungsten carbide, and quartz. Ceramic susceptors 105 are used to illustrate embodiments.

Figure 4:
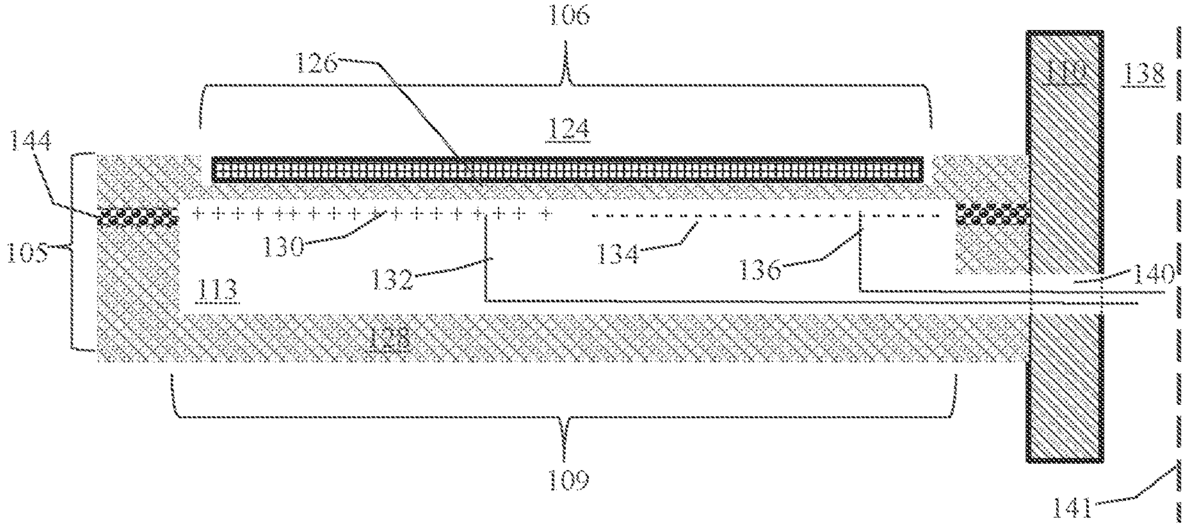
FIG. 4 is a cross-sectional view of a ceramic electrostatic chuck in a circular ceramic susceptor in accordance with embodiments.

FIG. 4 illustrates a cross sectional view of example ceramic electrostatic chuck having a lower and upper ceramic chuck welded together.

Referring to FIG. 4, ceramic susceptor 105 with wafer pockets 106 is attached to a central shaft 110 which may be hollow. The cross-sectional view extends from the center of the central shaft 110 as indicated by the dotted line 141 in FIG. 4, to the outside rim of the ceramic susceptor 105. A cross sectional view of the ceramic susceptor 105 through the wafer pocket 106 may comprise an upper ceramic chuck 126 and a lower ceramic chuck 128 welded together with quartz or ceramic welds 144. Quartz is glass and can be welded by heating the edges of the quartz pieces to a molten state and fusing the pieces together. In ceramic welding, a mixture of ceramic and metal particles can be projected onto a hot ceramic surface with oxygen. An exothermic reaction at the point of impact melts the ceramic particles and melts the ceramic surface forming a ceramic weld.

In this embodiment, upper ceramic chuck 126 and lower ceramic chuck 128 may enclose a hollow opening 113. Positive and negative electrostatic electrodes 130 and 134 may be formed in the upper ceramic chuck 126 on an underside of the wafer pocket 106. A thickness of the upper ceramic chuck 126 between the positive and negative electrostatic electrodes 130 and 134 and upper-side of the wafer pocket 106 is preferably 5 mm or less. The electrostatic electrodes, 130 and 134, may be formed using, for example, thin film technology, where thin metal films are deposited on ceramic layers by physical vapor deposition (PVD), chemical vapor deposition (CVD), or plasma-enhanced CVD (PECVD) and are patterned using laser trimming or lithography and wet/dry etch techniques. In certain embodiments, the electrostatic electrodes, 130 and 134, may be formed using printing techniques including stencil printing and 3D printing.

Wires 132 and 136 from the positive and negative electrostatic electrodes 130 and 134 may run through the hollow opening 113 and through a tubular opening 140 between the hollow opening 113 and the interior hollow 138 in the central shaft 110 where they may connect to a power supply (not shown). For high temperature processing, the wires may comprise a metal such as tungsten, titanium, tantalum, molybdenum, palladium, platinum, and nickel.

In certain embodiments, the positive and negative electrostatic electrodes 130 and 134 may be coupled wirelessly to a power supply. For example, inductive coupling may be employed. In such cases, an additional circuitry (e.g., a receiving coil) may be disposed within the ceramic susceptor 105, e.g., in one embodiment within the hollow opening 113 or attached to the central shaft 110 (e.g., within the interior hollow 138), and coupled to a transmitting coil. The received power may be processed within the circuitry to generate the associated DC power signals that are then supplied to the positive and negative electrostatic electrodes 130 and 134. In certain embodiments, the additional circuitry may comprise a dynamo, i.e., a circuit to convert the mechanical rotation of the ceramic susceptor 105 to generate power to charge the electrostatic electrodes of each of the ceramic electrostatic chucks.

Figure 5A:
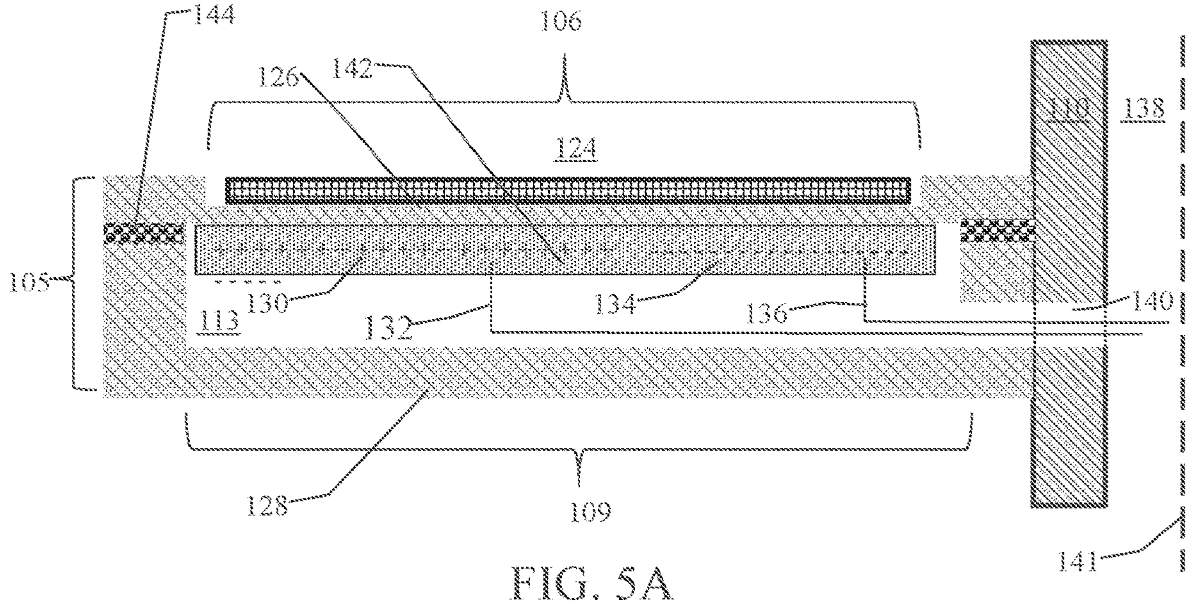
FIG. 5A is a cross-sectional view of a ceramic electrostatic chuck in a circular ceramic susceptor in accordance with embodiments.

FIG. 5A illustrates a cross sectional view of example ceramic electrostatic chuck having upper and lower ceramic chucks and a ceramic plate comprising electrodes. FIG. 5 illustrates an embodiment where the positive and negative electrostatic electrodes 130 and 134 are embedded in a ceramic plate 142 prior to being coupled to the underside of the upper ceramic chuck 126. A thickness of the upper ceramic chuck 126 below the wafer pocket 106 plus the thickness of the ceramic plate 142 above the positive and negative electrostatic electrodes 130 and 134 is preferably 5 mm or less. The electrostatic electrodes, 130 and 134, may be formed using, for example, thin film technology, where thin metal films are deposited on a ceramic plate 142 by physical vapor deposition (PVD), chemical vapor deposition (CVD), or plasma-enhanced CVD (PECVD) and patterned using laser trimming or lithography and wet/dry etch techniques. In certain embodiments, the electrostatic electrodes, 130 and 134, may be formed using printing techniques including stencil printing and 3D printing.

The positive and negative electrostatic electrodes 130 and 134 may be formed on the upper surface of the ceramic plate 142 before they are coupled to the upper ceramic chuck 126. Alternatively, they may be covered with a thin layer of insulating material using a deposition method such as ceramic spray followed by sintering prior to being coupled to the upper ceramic chuck 126. As described in a previous embodiment, the positive and negative electrostatic electrodes 130 and 134 may be coupled to a power supply using wires 132 and 136. Alternatively, they may be coupled to a power supply wirelessly using a form of inductive coupling.

Figure 5B:
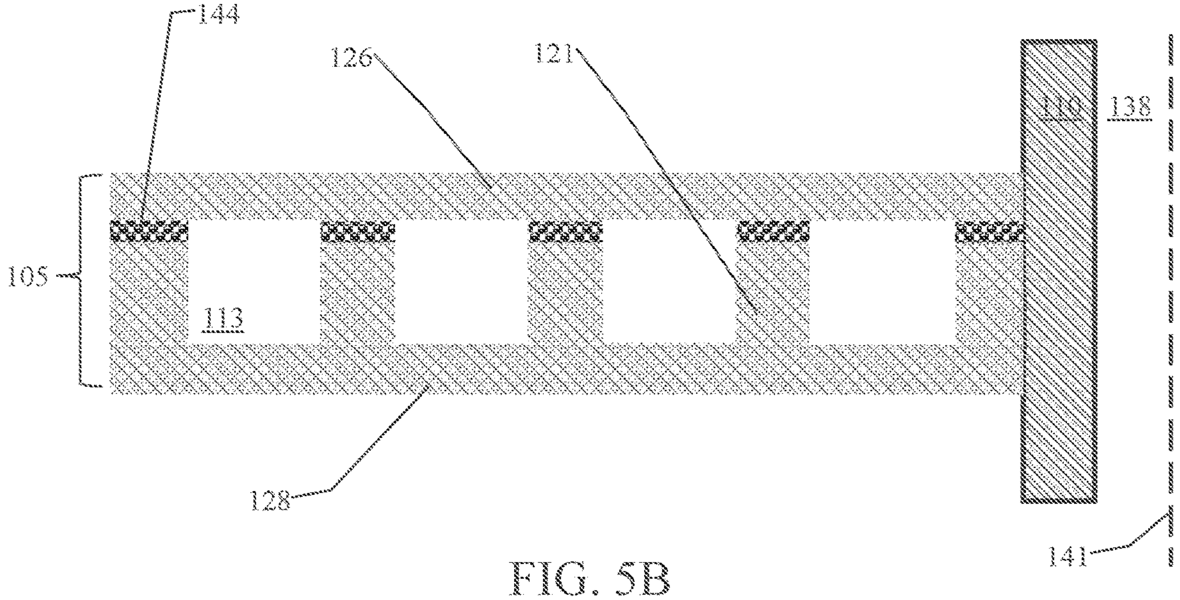
FIG. 5B is a cross-sectional view between ceramic electrostatic chucks in a circular ceramic susceptor in accordance with embodiments.

FIG. 5B is a cross-sectional view through half the ceramic susceptor 105 between two of the wafer pockets 106. The hollow opening 113 may be completely filled with ceramic material, or to reduce cost and weight as illustrated in FIG. 5B, ceramic support posts 121 may be added to reinforce the hollow opening 113 region.

Figure 6:
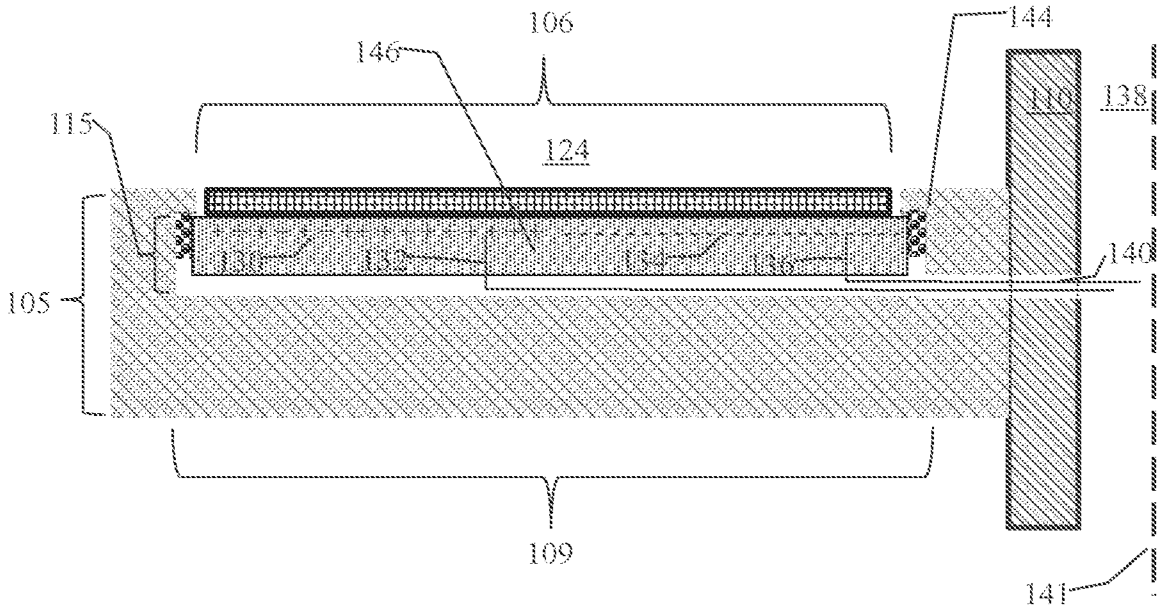
FIG. 6 is a cross-sectional view of a ceramic plate with electrostatic electrodes in a cavity and welded to a ceramic electrostatic chuck in a circular ceramic susceptor in accordance with embodiments.

Alternative embodiments for a susceptor with an electrostatic chuck are illustrated in FIG. 6 and FIG. 7. In the embodiment described in FIG. 4, the upper ceramic chuck 126 with a wafer pocket 106 is formed as part of the ceramic susceptor 105. Electrostatic electrodes 130 and 134 are formed in the upper ceramic chuck 126 on the underside of the wafer pocket 106. In the embodiment described in FIG.

5, the upper ceramic chuck 126 with a wafer pocket 106 is formed as part of the ceramic susceptor 105. Electrostatic electrodes 130 and 134 are embedded in a ceramic plate 142 which is attached to the upper ceramic chuck 126 on the underside of the wafer pocket 106. In FIG. 6, ceramic chucks 109 in the ceramic susceptor 105 are formed as a monolithic structure with a cavity 115. The cavity 115 is designed to accommodate upper ceramic plates 145 and 146 with embedded electrostatic electrodes 130 and 134.

FIG. 6 and FIGS. 7A, 7B, and 7C illustrate cross sectional views of example ceramic chucks 109 having cavity 115 and ceramic plates 145 and 146 but without lower and upper ceramic chucks in accordance with an embodiment of the disclosure. In contrast, in prior embodiments, the upper ceramic chuck is formed as part of the upper susceptor and the lower ceramic chuck as part of the lower susceptor, which are then welded together. In this embodiment illustrated in FIG. 6, the ceramic plate is not formed as part of the susceptor but may be included during assembly.

In the embodiment illustrated in FIG. 6, the ceramic chuck 109 comprises an upper ceramic plate 146 with positive and negative electrostatic electrodes 130 and 134 positioned in a cavity 115 in the ceramic chuck 109 and welded to form ceramic welds 144. In this embodiment, the upper ceramic plate 146 can be made thicker for improving mechanical strength. In addition, by replacing a separate upper ceramic chuck 126 with the upper ceramic plate 146, the positive and negative electrostatic electrodes 130 and 134 can be positioned in close proximity to the backside of the wafer 124 for robust wafer clamping. The electrostatic electrodes, 130 and 134, may be formed on the upper ceramic plate 146 using, for example, thin film technology, where thin metal films are deposited on a ceramic plate 142 by physical vapor deposition (PVD), chemical vapor deposition (CVD), or plasma-enhanced CVD (PECVD) and patterned using laser trimming or lithography and wet/dry etch techniques. In certain embodiments, the electrostatic electrodes, 130 and 134, may be formed on the upper ceramic plate 146 using printing techniques including stencil printing and 3D printing.

The positive and negative electrostatic electrodes 130 and 134 may then be covered with a layer of insulating material as thin as about 0.5 mm using a process such as a ceramic spray or ceramic powder coating followed by sintering. As described in a previous embodiment, the positive and negative electrostatic electrodes 130 and 134 may be coupled to a power supply with wires 132 and 136 or they may be coupled to a power supply wirelessly.

Figure 7A:
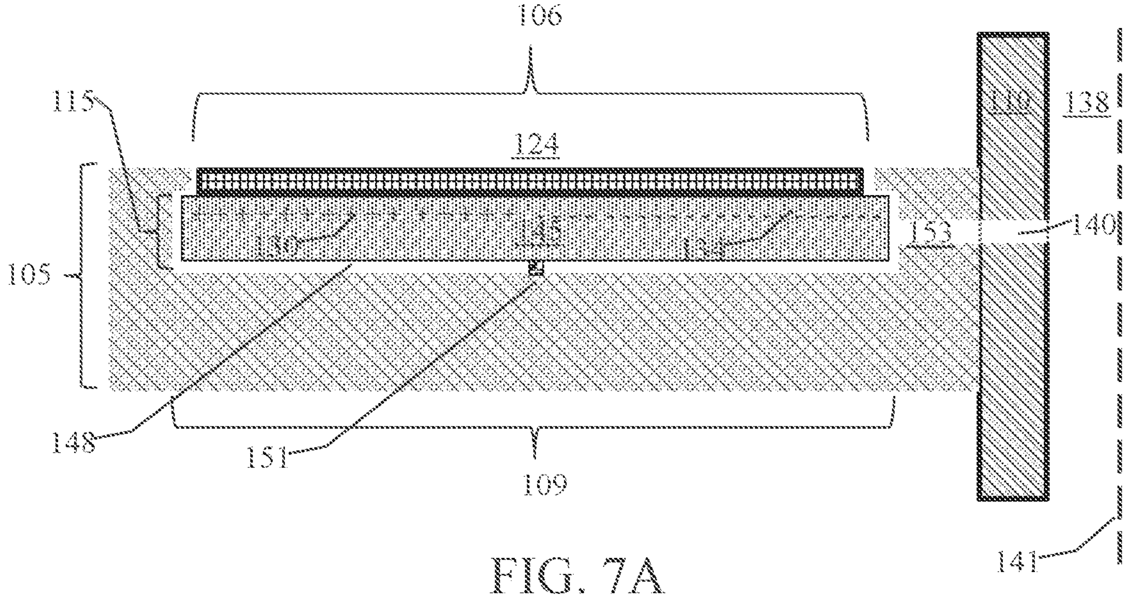
FIGS. 7A, 7B, and 7C are cross-sectional views of ceramic electrostatic chucks with a ceramic plate with electrostatic electrodes in a cavity in the ceramic electrostatic chuck and configured to rotate in a circular ceramic susceptor in accordance with embodiments.

FIG. 7A illustrates an embodiment where an upper ceramic plate 145 with positive and negative electrostatic electrodes 130 and 134 is configured to fit into a cavity 115 in the ceramic chuck 109 and is configured to rotate. The upper ceramic plate 145 may be mounted on a bearing 151 enabling it to rotate. Pockets configured to capture a gas flowing in from a gas channel 153 and rotate the upper ceramic plate 145 may be formed on the circumference of the upper ceramic plate 145. The flowing gas may be a gas such as air, nitrogen, argon, or helium.

Figure 7B:
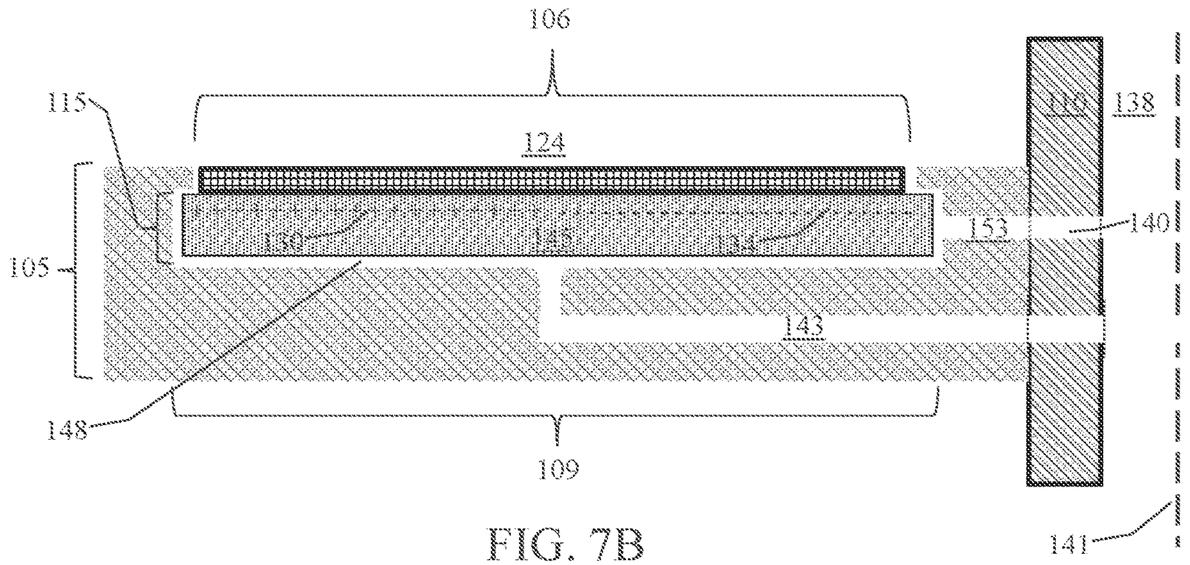

FIG. 7B illustrates an embodiment where gas inflow under the center of the wafer 124 from a second gas channel 143 may provide a cushion of air in a gas channel 148 between the upper ceramic plate 145 and the cavity 115. The cushion of air may enable the wafer 124 to rotate without a bearing 151. The gas may exit from the narrow gas channel 148 into the processing chamber 102 and be pumped away through an exhaust port 112 (FIG. 2).

Figure 7C:
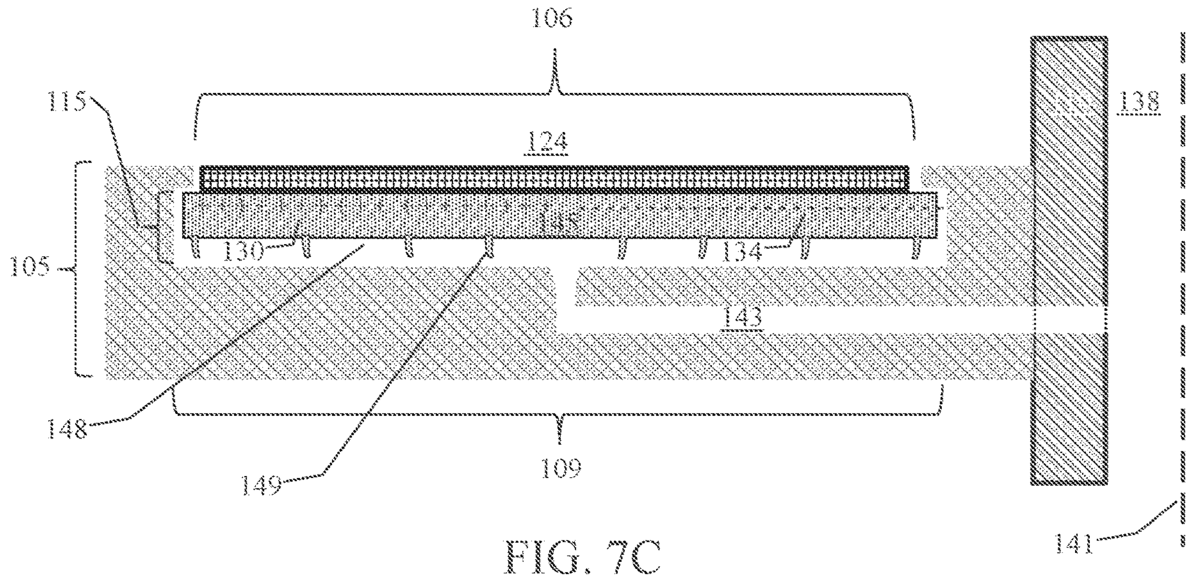

In FIG. 7C, vanes 149 can be on the underside of the upper ceramic plate 145. A flow of a gas from gas channel 143 to the center of the underside of the upper ceramic plate 145 may provide a cushion of air between the upper ceramic plate 145 and the cavity 115. Gas flowing from gas channel 143 may also push against the vanes 149 attached to the underside of the upper ceramic plate 145 causing it to rotate.

Rotation of wafer 124 in addition to rotation of the ceramic susceptor 105 during processing may additionally improve thin film composition and thickness uniformity. Other means of rotating the wafer 124 during processing are possible. The upper ceramic plate 145 may be mechanically rotated. Rotation may also be accomplished by embedding permanent magnets in the upper ceramic plate 145 and embedding electromagnets in the ceramic chuck 109.

Figure 10:
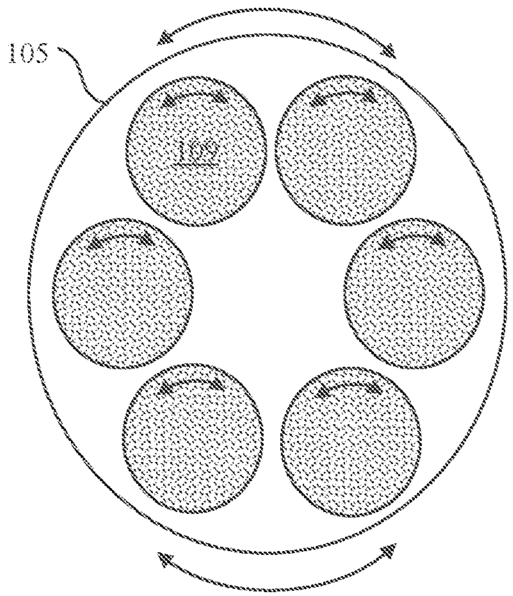
FIG. 10 is a top-down view illustrating rotation of the ceramic electrostatic chucks in addition to rotation of the circular ceramic susceptor during thin film deposition in accordance with embodiments.
Figure 11:
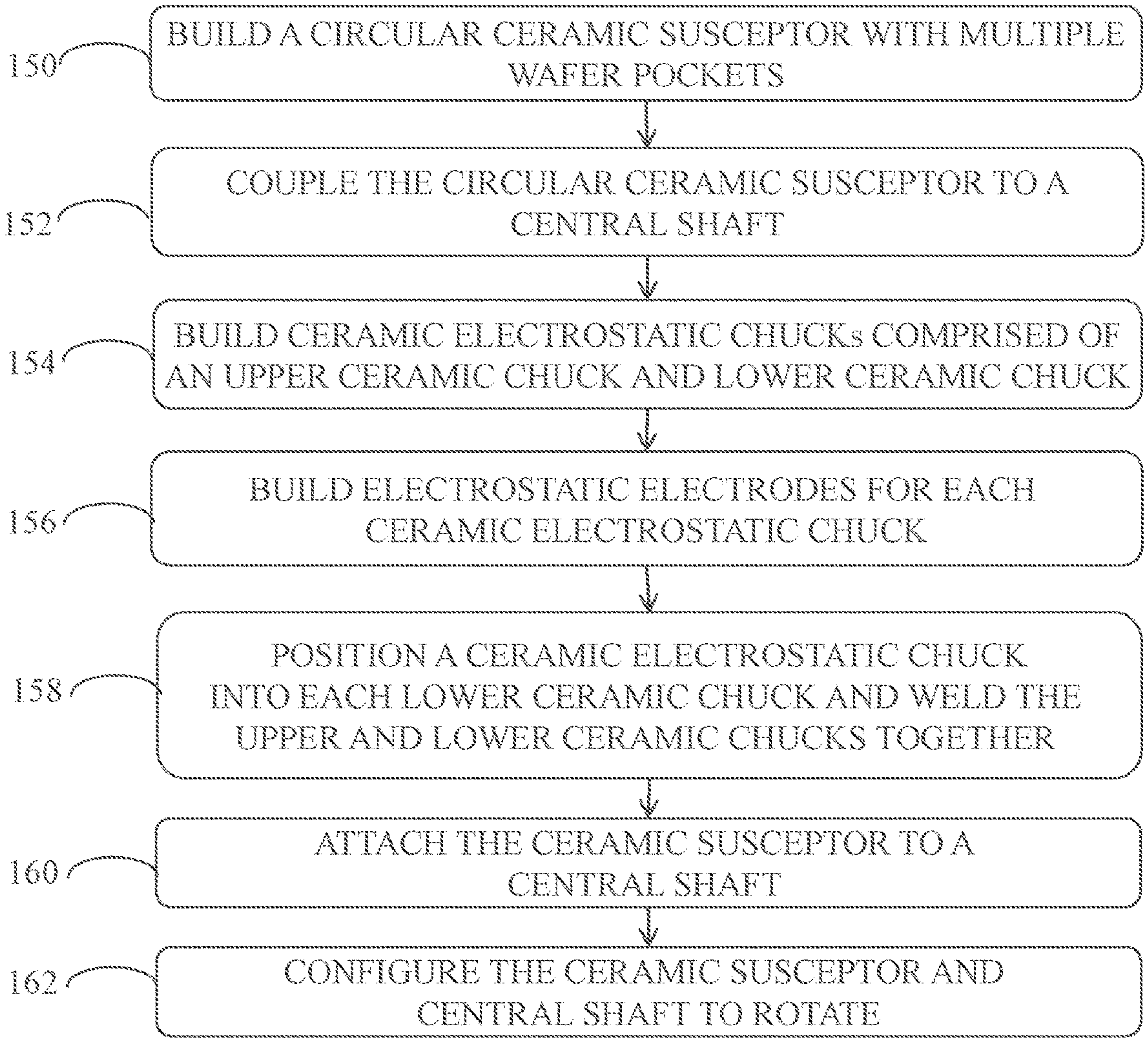
FIG. 11 is a flow diagram with blocks describing the steps involved in building ceramic electrostatic chucks in a circular ceramic susceptor illustrated in FIGS. 8A through 8G in accordance with embodiments.

A method of forming a batch thin film deposition apparatus 100 with electrostatic clamping of wafers 124 during thin film deposition is listed in blocks of the flow diagram in FIG. 11. The blocks in FIG. 11 are illustrated in the top-down views in FIG. 8A, FIG. 9, and FIG. 10, and in cross-sectional views of FIGS. 8B through 8G.

As further described in more detail in various embodiments, a method of forming an apparatus for processing a semiconductor includes assembling a circular ceramic susceptor with a plurality of wafer pockets; coupling the circular ceramic susceptor around a central shaft; assembling a plurality of ceramic electrostatic chucks, each of the ceramic electrostatic chucks comprising wafer pockets with underlying electrostatic electrodes; positioning one of the ceramic electrostatic chucks in each of the wafer pockets; and configuring the circular ceramic susceptor and the central shaft to rotate.

Figure 8A:
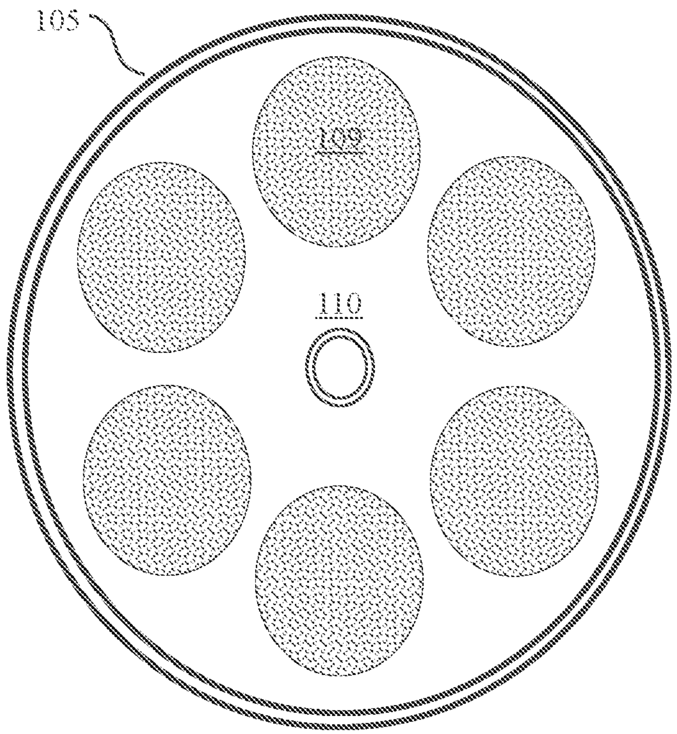
FIG. 8A is a top-down view of a circular ceramic susceptor with six wafer pockets in accordance with embodiments.

Referring now to block 150 of FIG. 11 and illustrated in the top-down view in FIG. 8A, a ceramic susceptor 105 with multiple ceramic chucks 109 is formed of a ceramic material such as quartz, alumina, zirconia, aluminum nitride, silicon carbide, and tungsten carbide. Susceptor molds may be filled with a ceramic powder or slurry and allowed to cure. The susceptor parts may then be removed from the molds and baked to drive off remaining solvent before sintering at a temperature sufficiently high to fuse the ceramic powder particles together into a ceramic glass. The ceramic susceptor 105 in FIG. 8A is shown with six wafer pockets. Depending upon the thin film deposition apparatus, the ceramic susceptor 105 may have a different number of wafer pockets 106.

Figure 8B:
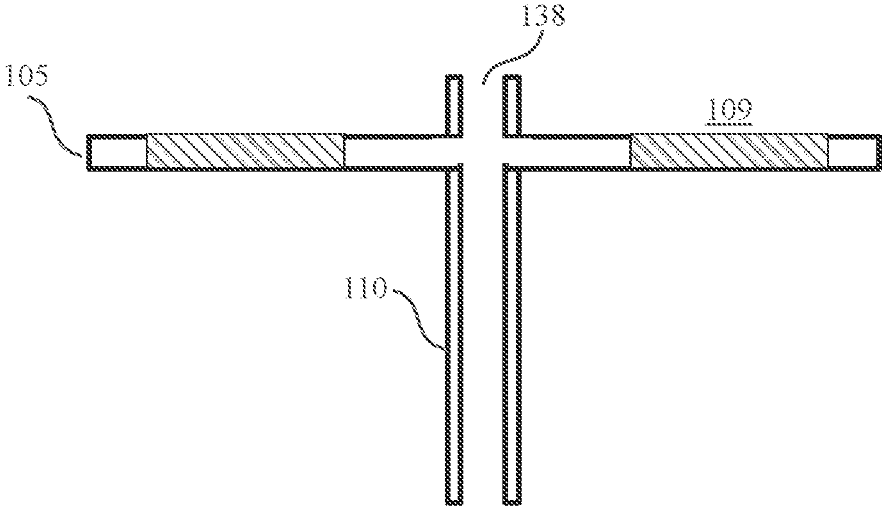
FIG. 8B is a cross-sectional view of a circular ceramic susceptor with wafer pockets and a central susceptor shaft in accordance with embodiments.

In block 152 of FIG. 11 and illustrated in the cross-sectional view in FIG. 8B, the ceramic susceptor 105 is attached to a central shaft 110 that runs through the center of the ceramic susceptor 105. The major plane of the ceramic susceptor 105 is perpendicular to the central axis of the central shaft 110.

In various embodiments, the central shaft 110 as illustrated in FIG. 8B may be hollow (illustrated by interior hollow 138). Gas tubing, liquid tubing, and electric wires may run through the interior of the central shaft 110 to supply gaseous and liquid heating and cooling to the ceramic chucks 109 and to provide electric power to resistive heaters and positive and negative electrostatic electrodes 130 and 134 in the ceramic chucks 109.

During a thin film deposition process, the central shaft 110 and ceramic susceptor 105 may rotate to improve across wafer thin film composition and thickness uniformity.

FIGS. 8C through 8G are cross sectional views through the left half of the ceramic susceptor 105 illustrating blocks in FIG. 11. The right half of the ceramic susceptor 105 is an exact duplicate mirror image of the left half. The ceramic susceptor 105 may be manufactured by first forming upper and lower portions of the ceramic susceptor 105 and welding them together with quartz welds or with ceramic welds 144. A ceramic chuck 109 designed to electrostatically clamp wafers 124 may be built under the wafer pockets 106 in the ceramic susceptor 105. An upper ceramic chuck 126 may be formed with a wafer pocket 106 when the upper portion of the ceramic susceptor 105 is formed. A lower ceramic chuck 128 may be formed beneath each wafer pocket 106 when the lower portion of the ceramic susceptor 105 is formed.

Figure 8C:
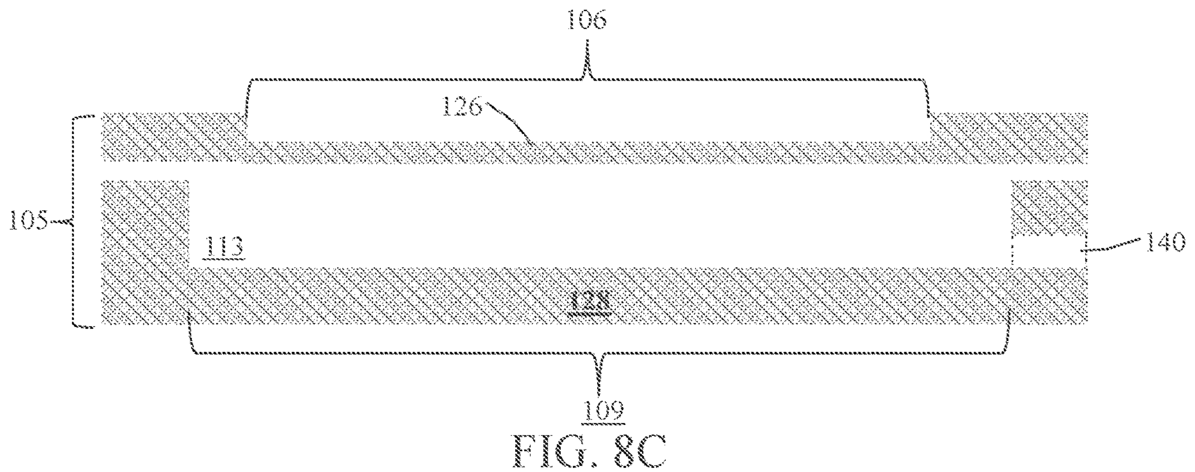
FIGS. 8C through 8G are cross-sectional views of steps in forming a ceramic electrostatic chuck in a circular ceramic susceptor in accordance with embodiments.

In block 154 of FIG. 11 and illustrated in the cross-sectional views in FIG. 8C, an upper ceramic chuck 126 and a lower ceramic chuck 128 may be formed. The upper ceramic chuck 126 with a wafer pocket 106 may be formed in the upper portion of the ceramic susceptor 105. The lower ceramic chuck 128 with a recess or hollow opening 113 to accommodate electrostatic electrodes may be formed in the lower portion of the ceramic susceptor 105. A tubular opening 140 through the wall of the lower ceramic chuck 128 may be formed to connect the recess or hollow opening 113 to the interior hollow 138 of the central shaft 110.

Figure 8D:
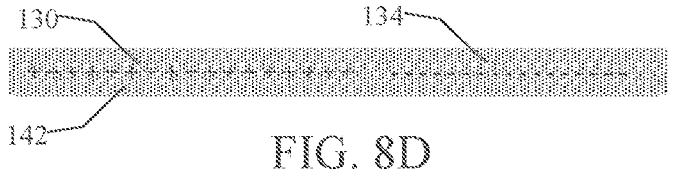
Figure 8E:
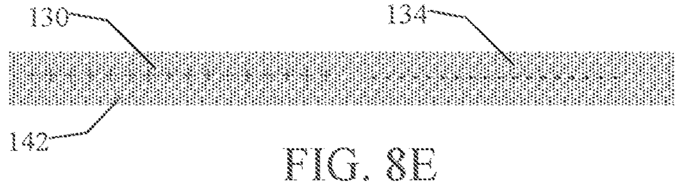

In block 156 of FIG. 11 and illustrated in the cross-sectional views in FIGS. 8D and 8E, positive and negative electrostatic electrodes 130 and 134 are formed on a ceramic plate 142. As illustrated in FIG. 8D, positive electrostatic electrode 130 and negative electrostatic electrode 134 are formed on the surface of a ceramic plate 142 in the ceramic chuck 109. The electrostatic electrodes, 130 and 134, may be formed using, for example, thin film technology, where thin metal films are deposited on a ceramic plate 142 by physical vapor deposition (PVD), chemical vapor deposition (CVD), or plasma-enhanced CVD (PECVD) and patterned using laser trimming or lithography and wet/dry etch techniques. The electrostatic electrodes, 130 and 134, may be formed using printing techniques in certain embodiments. The electrostatic electrodes may be comprised of a metal such as tungsten, titanium, tantalum, molybdenum, palladium, platinum, and nickel.

In FIG. 8E, the positive and negative electrostatic electrodes 130 and 134 may optionally be covered with a thin layer of insulating material using a process such as a ceramic spray or ceramic powder coating followed by sintering.

In block 158 of FIG. 11 and illustrated in the cross-sectional view in FIG. 8F, ceramic plate 142 with positive and negative electrostatic electrodes 130 and 134, is positioned in the ceramic chuck 109 near the underside of the upper ceramic chuck 126 and immediately below the wafer pocket 106. It is desirable for the positive and negative electrostatic electrodes 130 and 134 to be in close proximity (between about 0.5 mm to 5 mm) to the backside of the wafer 124 for robust wafer chucking. The ceramic plate 142 may be clamped to the underside of the wafer pocket 106 in the upper ceramic chuck 126 or may be coupled to the underside of the wafer pocket 106 using an adhesive.

Figure 8F:
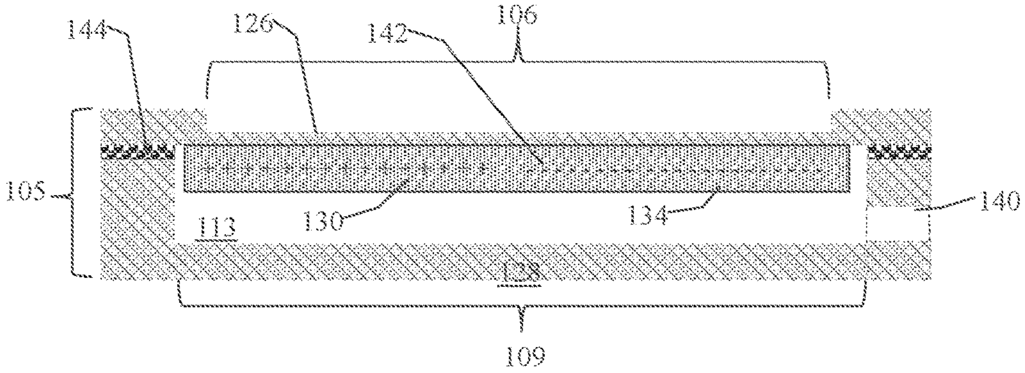

As is illustrated in FIG. 8F, the lower ceramic chuck 128 may be coupled to the upper ceramic chuck 126 with the same quartz welds or ceramic welds 144 used to weld the lower and upper portions of the ceramic susceptor 105 together. The ceramic chuck 109 may also include liquid channels for heating and cooling the ceramic chuck 109, gas channels for heating and cooling the wafer 124, a resistance heater for raising the temperature of the ceramic chuck 109, and wires to provide electrical power to the resistance heater and to the positive and negative electrostatic electrodes 130 and 134. Sensors such as temperature, pressure, voltage, and motion sensors may also be included in the ceramic chuck 109.

Figure 8G:
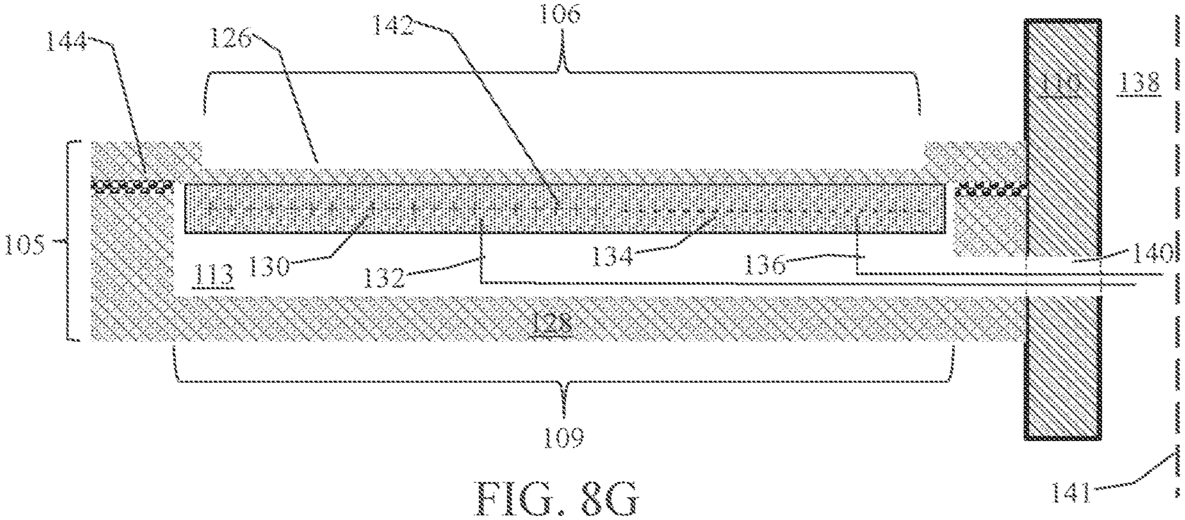

In block 160 in FIG. 11 and illustrated in the cross-sectional view in FIG. 8G, a the ceramic susceptor 105 may be attached to a central shaft 110 that runs through the center of the ceramic susceptor 105 and perpendicular to it. An interior hollow 138 of central shaft 110 is shown in FIG. 8G. Wires 132 and 136 connecting the positive and negative electrostatic electrodes 130 and 134 to a power supply (not shown) may run from the positive and negative electrostatic electrodes 130 and 134 in the ceramic chuck 109 and through a tubular opening 140 between the ceramic chuck 109 and the interior hollow 138 of the central shaft 110.

Figure 9:
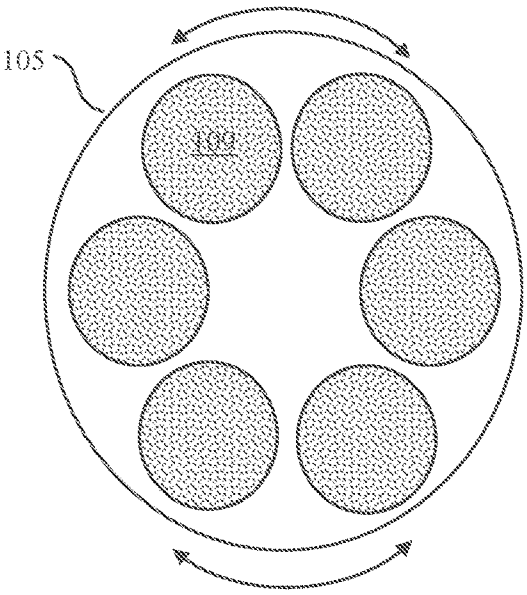
FIG. 9 is a top-down view illustrating rotation of a circular ceramic susceptor with multiple ceramic electrostatic chucks during thin film deposition in accordance with embodiments.

In block 162 in FIG. 11 and illustrated in the top-down views in FIGS. 9 and 10, the ceramic susceptor 105 and central shaft 110 may be configured to rotate during thin film deposition. Rotating the wafers 124 under the showerheads 116 during thin film deposition, may improve across wafer thin film composition and thickness uniformity.

FIG. 9 illustrates a ceramic susceptor 105 configured to pass the ceramic chucks 109 under the showerheads 116 as the ceramic susceptor 105 rotates. Particularly, as the ceramic susceptor 105 rotates, individual ceramic chucks 109 can travel under the showerheads 116.

FIG. 10 illustrates an embodiment previously introduced in FIG. 7, where the individual ceramic chucks 109 are configured to rotate about a central axis of each wafer pocket 106 as the ceramic susceptor 105 and central shaft 110 rotate the wafers under the showerheads 116. Rotation of the ceramic chucks 109 in addition to rotation of the ceramic susceptor 105 during thin film deposition may additionally improve thin film composition and thickness uniformity.

Figure 12A:
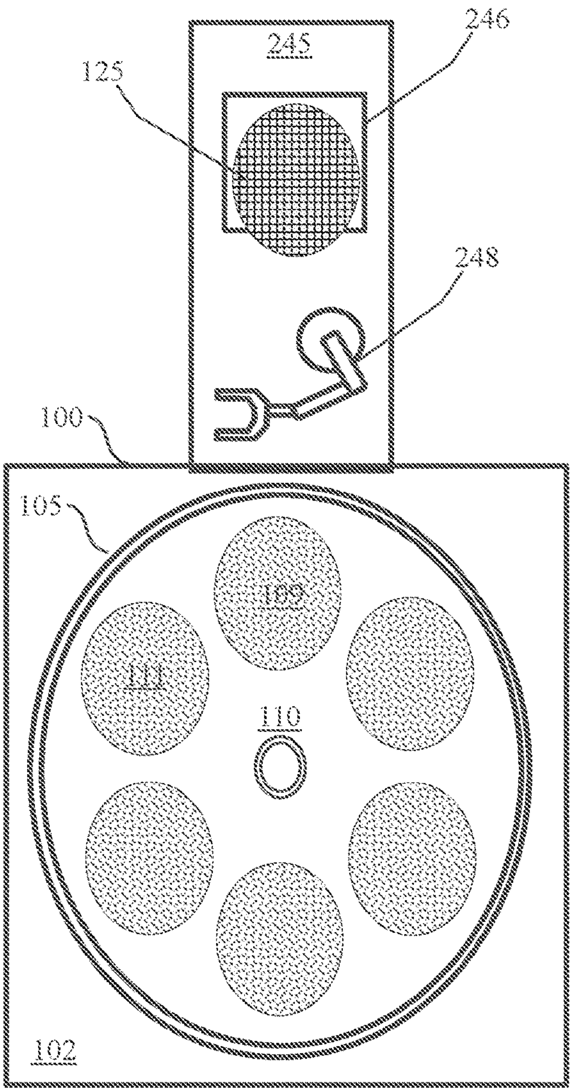
FIGS. 12A through 12F are top-down cross-sectional views illustrating a method of depositing a thin film in a batch wafer deposition apparatus with ceramic electrostatic chucks in accordance with embodiments.
Figure 12B:
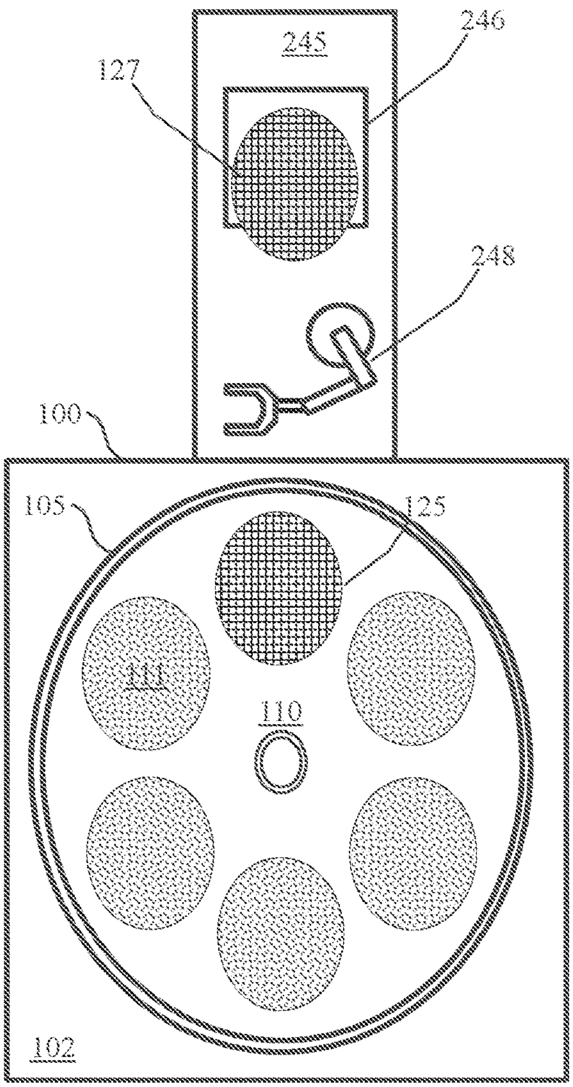
Figure 12C:
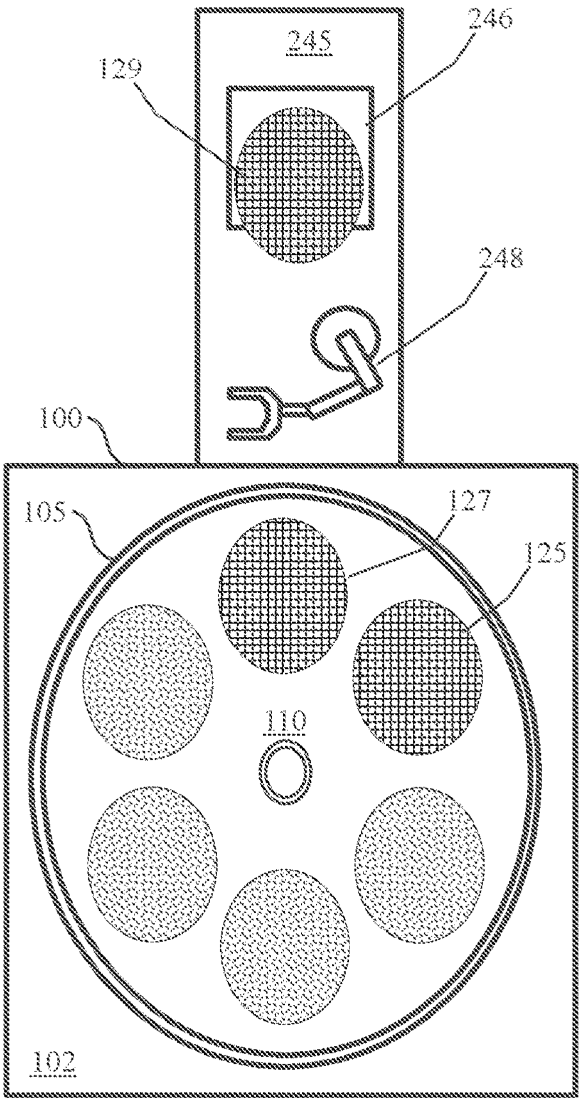
Figure 12D:
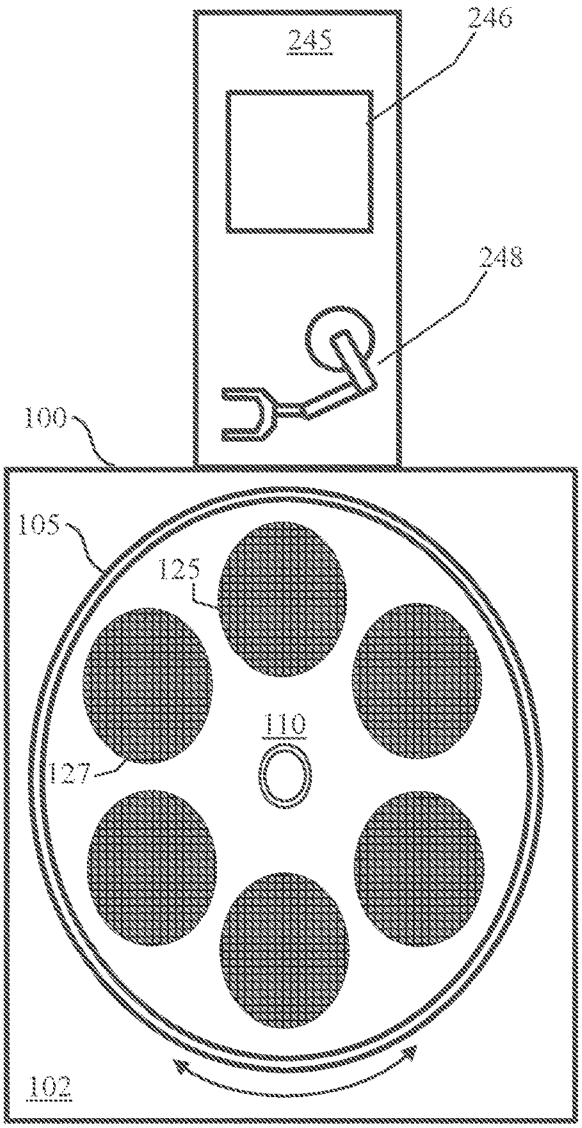
Figure 12E:
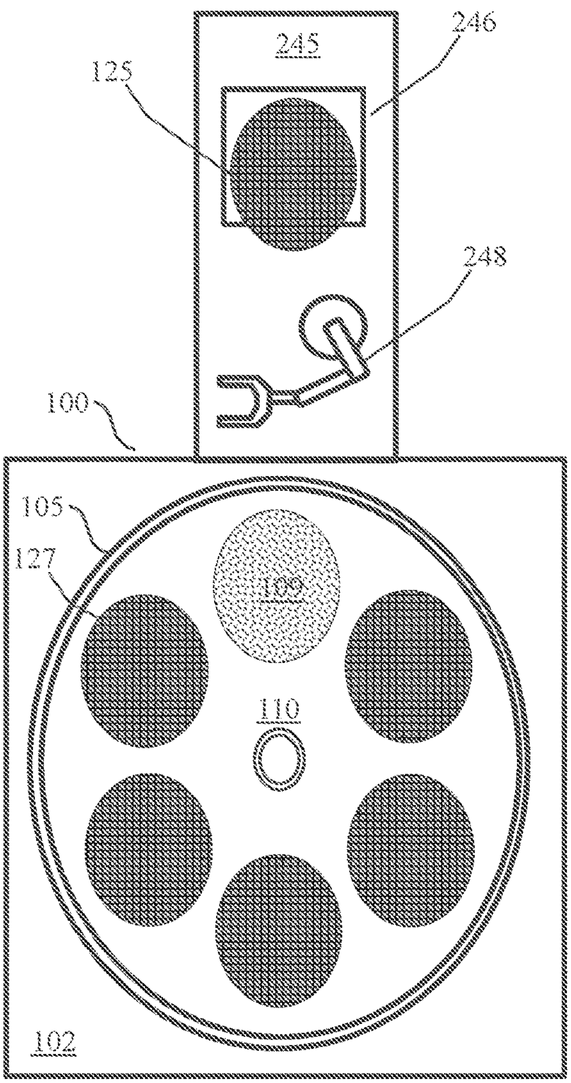
Figure 12F:
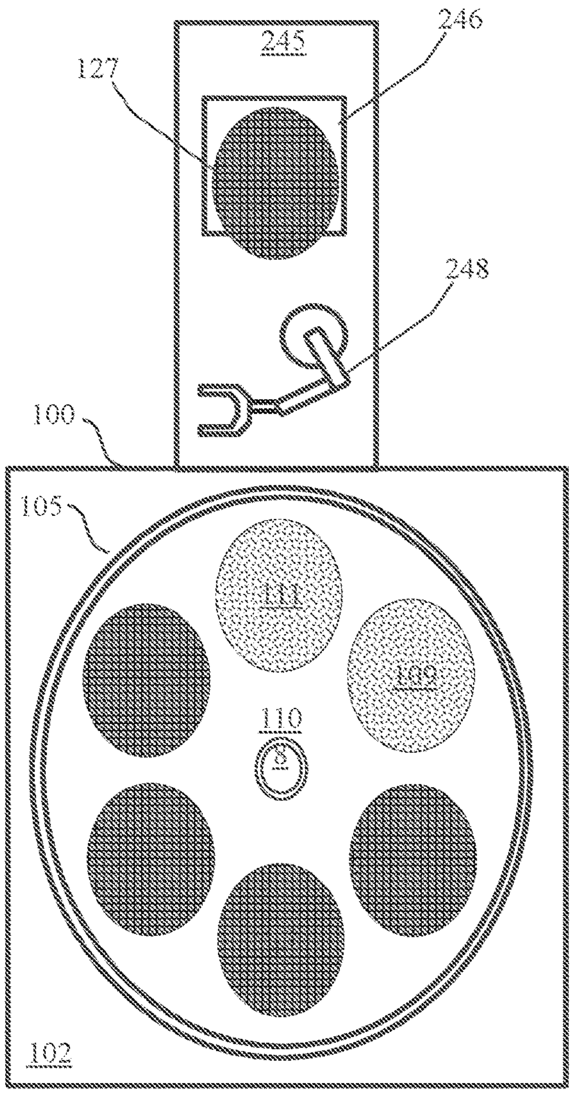
Figure 13:
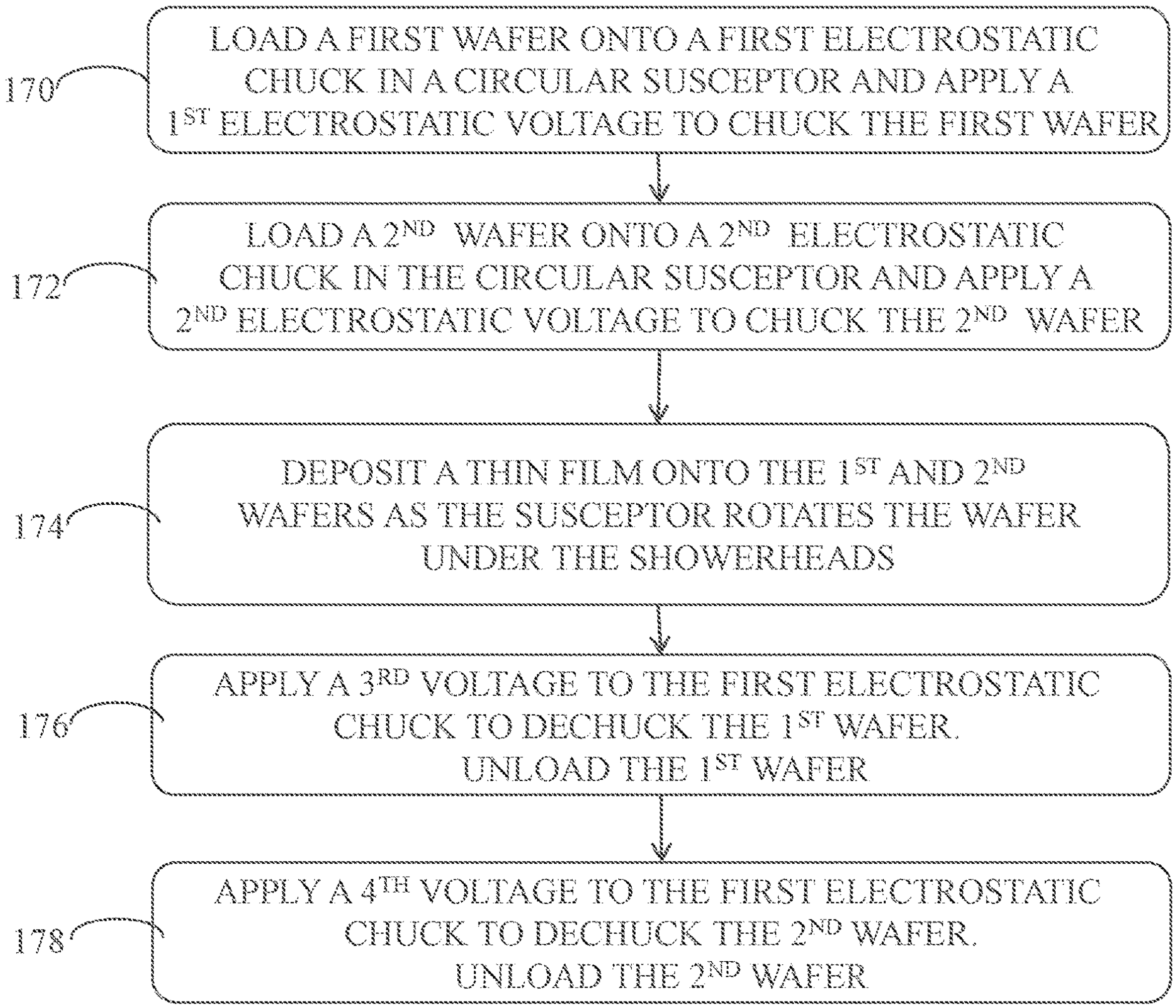
FIG. 13 is a flow diagram with blocks describing the steps involved in depositing a thin film illustrated in FIGS. 12A through 12F in accordance with embodiments.

A method of operating a batch thin film deposition apparatus 100 employing electrostatic clamping of the wafers 124 during a thin film deposition is listed in the blocks of the flow diagram in FIG. 13 and illustrated in top-down cross-sectional views in FIGS. 12A through 12F.

FIGS. 12A through 12F are top-down cross-sectional views of a batch thin film deposition apparatus 100. The batch thin film deposition process may be a chemical vapor deposition (CVD) process such as atmospheric pressure CVD (APCVD), sub-atmospheric pressure CVD (SACVD) low pressure CVD (LPCVD) and atomic layer deposition CVD (ALD). In addition, plasma enhanced CVD (PECVD) thin film deposition processes at various deposition temperatures and pressures may be performed in the batch thin film deposition apparatus 100. To achieve across wafer composition and thickness uniformity, the ceramic susceptor 105 with multiple ceramic chucks 109 onto which wafers 124 may be loaded and clamped is made to rotate under showerheads 116 during thin film deposition. In some embodiments, the ceramic chucks 109 may additionally rotate as the ceramic susceptor 105 rotates. When the thin film deposition process is not plasma assisted, bipolar or multipolar electrostatic clamping may be used. When the thin film is deposited using a PECVD process, monopolar electrostatic clamping may be used. When performing PECVD thin film depositions, bipolar or multipolar electrostatic clamping may be employed before the plasma is turned on and switched to monopolar electrostatic clamping once the plasma is struck.

The top-down view of the batch thin film deposition apparatus 100 in FIG. 12A shows a ceramic susceptor 105 with multiple ceramic chucks 109 and 111 configured to rotate about a central shaft 110. A wafer transfer chamber 245 with a wafer loading arm 248 is coupled to the processing chamber 102. The wafer loading arm 248 may load and unload wafers 125 and 127 from a wafer boat 246 in the wafer transfer chamber 245 and onto ceramic chucks 109 and 111 in the ceramic susceptor 105 in the processing chamber 102. First and second ceramic chucks 109 and 111 clamp the wafers 125 and 127 during thin film deposition.

In block 170 of FIG. 13 and illustrated in the top-down cross-sectional view in FIG. 12A, the wafer loading arm 248 may take a first wafer 125 out of the wafer boat 246 and load it onto a first ceramic chuck 109 on the ceramic susceptor 105. First electrostatic voltages may be applied to electrostatic electrodes in the first ceramic chuck 109 to clamp the first wafer 125.

In block 172 of FIG. 13 and illustrated in the top-down cross-sectional view in FIG. 12B, the wafer loading arm 248 may take a second wafer 127 out of the wafer boat 246 and load it onto a second ceramic chuck 111. Second electrostatic voltages may be applied to electrostatic electrodes in the second ceramic chuck 111 to clamp the second wafer 127.

The wafer loading procedure may be repeated until all the ceramic chucks in the ceramic susceptor 105 are filled with wafers.

In block 174 of FIG. 13 and illustrated in the top-down cross-sectional view in FIG. 12D, the ceramic susceptor 105 rotates under showerheads 116 during thin film deposition. In some embodiments, the ceramic chucks 109 and 111 rotate in addition to the ceramic susceptor 105 rotating. The thin film deposition may continue until the desired thin film thickness is achieved. When an atomic layer deposition (ALD) method is used many cycles of depositing a layer of a first gaseous precursor, purging the first gaseous precursor, reacting the layer of the first precursor with a second precursor to form an atomic layer of the desired thin film, and then repeating the cycle over and over until the desired thickness is deposited.

In block 176 of FIG. 13 and illustrated in the top-down cross-sectional view in FIG. 12D, a $3^{rd}$ electrostatic voltage may be applied to electrostatic electrodes in the first ceramic chuck 109 to de-chuck the first wafer 125. The wafer loading arm 248 may then unload the first wafer 125 from the ceramic susceptor 105 and load it into the wafer boat 246 in the wafer transfer chamber 245.

In block 178 of FIG. 13 and illustrated in the top-down cross-sectional view in FIG. 12E, a $4^{th}$ electrostatic voltage may be applied to electrodes in the $2^{nd}$ ceramic chuck 111 to de-chuck the second wafer 127. The wafer loading arm 248 may then unload the second wafer 127 from the ceramic susceptor 105 and load it into the wafer boat 246 in the wafer transfer chamber 245.

The wafer unloading procedure may be repeated until all the ceramic chucks in the ceramic susceptor 105 are emptied.

Electrostatic clamping of wafers during thin film deposition improves across wafer thin film composition and thickness uniformity. This is especially advantageous when wafers are warped such as when stacks of thin films with high stress are deposited on the wafers. This is also advantageous when rotation may dislodge wafers during deposition.

Example embodiments of the present invention are summarized here. Other example embodiments can also be understood from the entirety of the specification and the claims filed herein.

Example 1. A semiconductor processing apparatus includes a processing chamber with a showerhead and a circular ceramic susceptor disposed in the processing chamber, the ceramic susceptor being coupled to a central susceptor shaft. The ceramic susceptor includes a first wafer pocket, which includes a first ceramic electrostatic chuck for supporting a first wafer. The ceramic susceptor is configured to rotate the first wafer pocket under the showerhead, where the first ceramic electrostatic chuck is configured to rotate within the first wafer pocket.

Example 2. The apparatus of example 1, where the ceramic susceptor further includes a second wafer pocket including a second ceramic electrostatic chuck for supporting a second wafer, and where the second ceramic electrostatic chuck is configured to rotate within the second wafer pocket.

Example 3. The apparatus of one of examples 1 to 2, where the first ceramic electrostatic chuck includes a ceramic plate configured to rotate around a central axis of the first wafer pocket, a gas outlet for releasing gas below a central region of the first wafer pocket and to enable rotation of the ceramic plate.

Example 4. The apparatus of one of examples 1 to 3, where the first ceramic electrostatic chuck includes a ceramic plate configured to rotate around a central axis of the first wafer pocket, and circuitry for receiving power wirelessly to power the rotation of the ceramic plate.

Example 5. The apparatus of one of examples 1 to 4, where the processing apparatus is configured to operate at a temperature up to about 800° C., where the circular ceramic susceptor includes a ceramic material selected from a group consisting of quartz, alumina, zirconia, aluminum nitride, silicon carbide, and tungsten carbide, and where electrostatic electrodes in the first ceramic electrostatic chuck are made of a metal selected from a group including tungsten, titanium, tantalum, molybdenum, palladium, platinum, and nickel.

Example 6. The apparatus of one of examples 1 to 5, where an electrostatic electrode is embedded 0.5 mm to 5 mm below an upper surface of the first ceramic electrostatic chuck upon which a wafer is to be loaded.

Example 7. The apparatus of one of examples 1 to 6, where the first ceramic electrostatic chuck is included of an upper ceramic electrostatic chuck and a lower ceramic chuck that are welded together.

Example 8. The apparatus of one of examples 1 to 7, where an electrostatic voltage signal is supplied to an electrostatic electrode through a wire disposed in the susceptor shaft, the wire being coupled between the electrostatic electrode and a power supply.

Example 9. The apparatus of one of examples 1 to 8, further including circuitry for receiving power for generating an electrostatic voltage by wireless transmission.

Example 10. The apparatus of one of examples 1 to 9, where the apparatus is additionally configured for plasma processing and the first ceramic electrostatic chuck is configured to operate as a bipolar electrostatic chuck, a multipolar electrostatic chuck, and as a monopolar electrostatic chuck.

Example 11. A method of forming an apparatus for processing a semiconductor includes providing a circular ceramic susceptor with a plurality of wafer pockets, the circular ceramic susceptor being supported by a central shaft. The method includes assembling a plurality of ceramic electrostatic chucks, where each of the ceramic electrostatic chucks including wafer pockets with underlying electrostatic electrodes. The method includes positioning one of the ceramic electrostatic chucks in each of the wafer pockets, and configuring the circular ceramic susceptor and the central shaft to rotate.

Example 12. The method of example 11, where assembling the plurality of ceramic electrostatic chucks includes forming the plurality of ceramic electrostatic chucks.

Example 13. The method of one of examples 11 to 12, where forming one of the plurality of ceramic electrostatic chucks includes: forming an upper ceramic chuck and a lower ceramic chuck; embedding the electrostatic electrodes within a ceramic plate; coupling the ceramic plate to an underside of the upper ceramic chuck such that the electrostatic electrodes are 0.5 mm to 5 mm from a topside surface of the one of the upper ceramic chucks; inserting the ceramic plate into a hollow opening in the lower ceramic chuck; welding the upper ceramic chuck to the lower ceramic chuck; and coupling the electrostatic electrodes to a DC power supply.

Example 14. The method of one of examples 11 to 13, where forming one of the plurality of ceramic electrostatic chucks includes: forming an upper ceramic chuck and a lower ceramic chuck; forming the electrostatic electrodes on an underside of the upper ceramic chuck such that the electrostatic electrodes are 0.5 mm to 5 mm from a topside surface of the one of the upper ceramic chucks; welding the upper ceramic chuck to the lower ceramic chuck; and coupling the electrostatic electrodes to a DC power supply.

Example 15. The method of one of examples 11 to 14, where forming one of the plurality of ceramic electrostatic chucks includes: forming a cavity in a ceramic electrostatic chuck; forming an electrostatic electrode in an upper ceramic plate such that the electrostatic electrode is 0.5 mm to 5 mm from a topside surface; and configuring the upper ceramic plate to fit into the cavity in the ceramic electrostatic chuck and to rotate.

Example 16. The method of one of examples 11 to 15, where forming one of the plurality of ceramic electrostatic chucks includes: forming a cavity in a ceramic electrostatic chuck; forming an electrostatic electrode in an upper ceramic plate; and configuring the upper ceramic plate to fit into the cavity; and welding the upper ceramic plate to the ceramic electrostatic chuck.

Example 17. The method of one of examples 11 to 16, further including wirelessly supplying an electrostatic voltage to the electrostatic electrode.

Example 18. A method of operating a semiconductor processing apparatus includes loading a first semiconductor wafer onto a first ceramic electrostatic chuck in a ceramic susceptor disposed in a semiconductor processing chamber, and applying first electrostatic voltage signals to a first bipolar electrostatic electrode in the first ceramic electrostatic chuck, and chucking the first semiconductor wafer. The method includes loading a second semiconductor wafer onto a second ceramic electrostatic chuck in the ceramic susceptor, and applying second electrostatic voltage signals to a second bipolar electrostatic electrode in the second ceramic electrostatic chuck, and chucking the second semiconductor wafer. The method includes rotating the susceptor to pass the first and the second semiconductor wafers under a showerhead, and depositing a thin film on the first and the second semiconductor wafers when rotating the susceptor. The method includes stopping the rotating of the susceptor after the depositing; applying third electrostatic voltage signals to the first bipolar electrostatic electrode to de-chuck the first semiconductor wafer and unloading the first semiconductor wafer; and applying fourth electrostatic voltage signals to the second bipolar electrostatic electrode to de-chuck the second semiconductor wafer and unloading the second semiconductor wafer.

Example 19. The method of example 18, further including: generating a plasma in the semiconductor processing chamber; and operating the first ceramic electrostatic chuck as a monopolar electrostatic chuck.

Example 20. The method of one of examples 18 to 19, further including rotating the first ceramic electrostatic chuck in addition to rotating the susceptor.

Example 21. The method of one of examples 18 to 20, where the ceramic susceptor is supported by a central shaft, where the first ceramic electrostatic chuck includes an upper ceramic plate disposed in a cavity within the first ceramic electrostatic chuck, and an electrostatic electrode disposed in the upper ceramic plate, and where the method further includes: streaming an inert gas through a gas tube from the central shaft to the cavity; and rotating the upper ceramic plate by streaming the inert gas around a base of the upper ceramic plate.

In the preceding description, specific details have been set forth, such as particular processes and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor processing apparatus comprising:

a processing chamber with a showerhead; and a circular ceramic susceptor disposed in the processing chamber, the ceramic susceptor being coupled to a central susceptor shaft, the ceramic susceptor comprising a first wafer pocket, the first wafer pocket comprising a first ceramic electrostatic chuck for supporting a first wafer, the first ceramic electrostatic chuck comprising a ceramic plate with embedded electrodes coupled beneath the first wafer pocket, and wires from the embedded electrodes running through a hollow opening in the first ceramic electrostatic chuck and through a tubular opening to an interior hollow of the central susceptor shaft, the first ceramic electrostatic chuck is configured to operate as a bipolar electrostatic chuck, the ceramic susceptor being configured to rotate the first wafer pocket under the showerhead, wherein the first ceramic electrostatic chuck is configured to rotate within the first wafer pocket.

2. The apparatus of claim 1, wherein the ceramic susceptor further comprises a second wafer pocket comprising a second ceramic electrostatic chuck for supporting a second wafer, and wherein the second ceramic electrostatic chuck is configured to rotate within the second wafer pocket.

3. The apparatus of claim 1, wherein the first ceramic electrostatic chuck comprises:

a ceramic plate configured to rotate around a central axis of the first wafer pocket, a gas outlet for releasing gas below a central region of the first wafer pocket and to enable rotation of the ceramic plate.

4. The apparatus of claim 1, wherein the first ceramic electrostatic chuck comprises a ceramic plate configured to rotate around a central axis of the first wafer pocket, and circuitry for receiving power wirelessly to power the rotation of the ceramic plate.

5. The apparatus of claim 1, wherein the processing apparatus is configured to operate at a temperature up to about 800° C., wherein the circular ceramic susceptor comprises a ceramic material selected from a group consisting of quartz, alumina, zirconia, aluminum nitride, silicon carbide, and tungsten carbide, and wherein electrostatic electrodes in the first ceramic electrostatic chuck are made of a metal selected from a group including tungsten, titanium, tantalum, molybdenum, palladium, platinum, and nickel.

6. The apparatus of claim 1, wherein an electrostatic electrode of the embedded electrodes is embedded 0.5 mm to 5 mm below an upper surface of the first ceramic electrostatic chuck upon which a wafer is to be loaded.

7. The apparatus of claim 1, wherein the first ceramic electrostatic chuck is comprised of an upper ceramic electrostatic chuck and a lower ceramic chuck that are welded together.

8. The apparatus of claim 1, wherein an electrostatic voltage signal is supplied to an electrostatic electrode through the wire disposed in the susceptor shaft, the wire being coupled between the electrostatic electrode and a power supply.

9. The apparatus of claim 1, further comprising circuitry for receiving power for generating an electrostatic voltage by wireless transmission.

10. The apparatus of claim 1, wherein the apparatus is additionally configured for plasma processing and the first ceramic electrostatic chuck is further configured to operate as a multipolar electrostatic chuck, and as a monopolar electrostatic chuck.

11. A method of forming an apparatus for processing a semiconductor, the method comprising:

providing a circular ceramic susceptor with a plurality of wafer pockets, the circular ceramic susceptor supported by a central shaft;

assembling a plurality of ceramic electrostatic chucks, each of the ceramic electrostatic chucks comprising wafer pockets with underlying electrostatic electrodes, wherein assembling one of the plurality of ceramic electrostatic chucks comprises forming an upper ceramic chuck and a lower ceramic chuck and embedding the electrostatic electrodes within a ceramic plate, wires from the electrostatic electrodes running through a hollow opening between the upper ceramic chuck and the lower ceramic chuck and through a tubular opening to an interior hollow of the central shaft, each of the ceramic electrostatic chucks being configured to operate as a bipolar electrostatic chuck, a multipolar electrostatic chuck, and as a monopolar electrostatic chuck;

positioning one of the ceramic electrostatic chucks in each of the wafer pockets; and configuring the circular ceramic susceptor and the central shaft to rotate.

12. The method of claim 11, wherein assembling the plurality of ceramic electrostatic chucks comprises forming the plurality of ceramic electrostatic chucks.

13. The method of claim 12, wherein forming one of the plurality of ceramic electrostatic chucks comprises:

coupling the ceramic plate to an underside of the upper ceramic chuck such that the electrostatic electrodes are 0.5 mm to 5 mm from a topside surface of one of the upper ceramic chucks;

inserting the ceramic plate into a hollow opening in the lower ceramic chuck;

welding the upper ceramic chuck to the lower ceramic chuck; and coupling the electrostatic electrodes to a DC power supply.

14. The method of claim 12, wherein forming one of the plurality of ceramic electrostatic chucks comprises:

forming an upper ceramic chuck and a lower ceramic chuck;

forming the electrostatic electrodes on an underside of the upper ceramic chuck such that the electrostatic electrodes are 0.5 mm to 5 mm from a topside surface of the one of the upper ceramic chucks;

welding the upper ceramic chuck to the lower ceramic chuck; and coupling the electrostatic electrodes to a DC power supply.

15. The method of claim 12, wherein forming one of the plurality of ceramic electrostatic chucks comprises:

forming a cavity in a ceramic electrostatic chuck;

forming an electrostatic electrode in an upper ceramic plate such that the electrostatic electrode is 0.5 mm to 5 mm from a topside surface; and configuring the upper ceramic plate to fit into the cavity in the ceramic electrostatic chuck and to rotate.

16. The method of claim 12, wherein forming one of the plurality of ceramic electrostatic chucks comprises:

forming a cavity in a ceramic electrostatic chuck;

forming an electrostatic electrode in an upper ceramic plate;

configuring the upper ceramic plate to fit into the cavity; and welding the upper ceramic plate to the ceramic electrostatic chuck.

17. The method of claim 11, further comprising wirelessly supplying an electrostatic voltage to the electrostatic electrode.

18. A method of operating a semiconductor processing apparatus, the method comprising:

loading a first semiconductor wafer onto a first ceramic electrostatic chuck in a ceramic susceptor disposed in a semiconductor processing chamber, applying first electrostatic voltage signals to a first bipolar electrostatic electrode in the first ceramic electrostatic chuck, and chucking the first semiconductor wafer;

loading a second semiconductor wafer onto a second ceramic electrostatic chuck in the ceramic susceptor, the ceramic susceptor being supported by a central shaft having an interior hollow, each of the first ceramic electrostatic chuck and the second ceramic electrostatic chuck in the ceramic susceptor comprising an upper ceramic chuck and a lower ceramic chuck welded together enclosing a hollow opening, a ceramic plate with embedded bipolar electrostatic electrodes coupled to an underside of the upper ceramic chuck beneath a respective wafer pocket, and wires from the embedded bipolar electrostatic electrodes running through the hollow opening and through a tubular opening between the hollow opening and the interior hollow of the central shaft, applying second electrostatic voltage signals to a second bipolar electrostatic electrode in the second ceramic electrostatic chuck, and chucking the second semiconductor wafer;

rotating the ceramic susceptor to pass the first and the second semiconductor wafers under a showerhead;

depositing a thin film on the first and the second semiconductor wafers when rotating the ceramic susceptor;

stopping the rotating of the ceramic susceptor after the depositing;

applying third electrostatic voltage signals to the first bipolar electrostatic electrode to de-chuck the first semiconductor wafer and unloading the first semiconductor wafer; and applying fourth electrostatic voltage signals to the second bipolar electrostatic electrode to de-chuck the second semiconductor wafer and unloading the second semiconductor wafer.

19. The method of claim 18, further comprising:

generating a plasma in the semiconductor processing chamber; and operating the first ceramic electrostatic chuck as a monopolar electrostatic chuck.

20. The method of claim 18, further comprising rotating the first ceramic electrostatic chuck in addition to rotating the ceramic susceptor.

21. The method of claim 18, wherein the ceramic susceptor is supported by a central shaft, wherein the first ceramic electrostatic chuck comprises an upper ceramic plate disposed in a cavity within the first ceramic electrostatic chuck, and an electrostatic electrode disposed in the upper ceramic plate, and wherein the method further comprises:

streaming an inert gas through a gas tube from the central shaft to the cavity; and rotating the upper ceramic plate by streaming the inert gas around a base of the upper ceramic plate.

* * * * *